(12) United States Patent
Heo

(10) Patent No.: US 6,218,232 B1
(45) Date of Patent: Apr. 17, 2001

(54) METHOD FOR FABRICATING DRAM DEVICE

(75) Inventor: Yeon Cheol Heo, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/222,512

(22) Filed: Dec. 29, 1998

(30) Foreign Application Priority Data

Dec. 30, 1997 (KR) .................................................. 97-77847

(51) Int. Cl.$^7$ .............................................. H01L 21/8234
(52) U.S. Cl. ........................ 438/238; 239/253; 239/254; 239/396; 239/397
(58) Field of Search ...................... 438/238, 397, 438/239, 253, 254, 396, 252

(56) References Cited

U.S. PATENT DOCUMENTS

| 5,001,526 | 3/1991 | Gotou ................... 357/23.6 |
| 5,525,531 | 6/1996 | Bronner et al. .......... 437/52 |
| 5,525,533 | 6/1996 | Woodruff et al. ........ 437/60 |
| 5,595,925 | * 1/1997 | Chen et al. ............. 437/52 |
| 5,670,409 | * 9/1997 | Otori et al. ............ 437/60 |
| 5,753,551 | 5/1998 | Sung ..................... 438/253 |
| 5,770,484 | 6/1998 | Kleinhenz ............... 438/155 |

FOREIGN PATENT DOCUMENTS

| 08088332 | 4/1996 | (JP) ............... H01L/27/108 |
| 09082912 | 3/1997 | (JP) ............... H01L/27/108 |
| 09275134 | 10/1997 | (JP) ............... H01L/21/762 |

* cited by examiner

*Primary Examiner*—Richard Elms
*Assistant Examiner*—Pho Luu
(74) *Attorney, Agent, or Firm*—Ladas & Parry

(57) ABSTRACT

A method for fabricating a DRAM device, comprising the steps of: providing a SOI substrate upon which a first silicon layer, a buried oxide film and a second silicon layer are stacked; forming an isolation film in the second silicon layer; forming first and second trenches in the second silicon layer and the isolation film; forming gate electrodes in both sidewalls of the first and second trenches; forming first and second impurity regions in the upper surface of both sides of the first trenches and third and fourth impurity regions beneath the first and second trenches by injecting impurity ions into the second silicon layer; forming a capacitor to contact the first and the second impurity regions via first and second contact holes in a first intermediate insulating layer, and a first wiring to contact with the fourth impurity region via third contact hole in the first insulating layer; forming a first conductive layer pattern including a second wiring to contact with the first wiring via fourth contact hole on a second first intermediate insulating layer; bonding a dummy substrate to a third intermediate insulating layer; removing the first silicon layer; forming a bit line and a third wiring connected to third and the fourth impurity regions via fifth and sixth contact holes in the buried oxide film; and forming a second conductive layer pattern including a fourth wiring to contact with the third wiring via seventh contact hole on a fourth intermediate layer.

13 Claims, 12 Drawing Sheets

METHOD FOR FABRICATING DRAM DEVICE

BACKGROUND OF THE INVENTION

1. Field of the Invention

The present invention is related to a method for fabricating a Dynamic Random Access Memory "DRAM", more particularly to a method for fabricating DRAM device applicable to a highly integrated device.

2. Description of the Related Art

DRAM device is comprised of a cell array part in which memory cells are arranged in a matrix configuration, and a peripheral circuit part for driving the cell array part. In the cell array part, DRAM cells consisting of one transistor and one capacitor are arranged. DRAM cells are connected to word lines and bit lines On the other hand, the integrity of DRAM device has improved according to the current technical developments in the field of semiconductor device. The improvement in the integrity of the DRAM device incurs reduction in size, i.e. in entire width. In case the width of device is reduced, the distance between the capacitor and the bit line is shortened and the parasitic capacitance therebetween is increased. A signal distortion phenomenon appears thereby causing malfunctions in DRAM device.

Accordingly, there have been proposed various studies to improve the integrity of DRAM device with reduction in width. Among those studies, there is a method to improve the integrity by increasing the number of layers used for DRAM device or by increasing the aspect ratio of the layers. Although this method may contribute to the integrity of DRAM, however it is not desirable since it makes the sequential processes difficult.

Also proposed is another method that the bit line and the capacitor are formed on the opposite sides of the substrate respectively. There is generated little parasitic capacitance between the bit line and the capacitor according to the above structural characteristics. Consequently, this is an effective method for highly integrated device.

FIGS. 1A to 1F are sectional views for showing a conventional DRAM fabricating method that the bit line and the capacitor are formed on the opposite sides of the substrate respectively.

Referring to FIG. 1A, an SOI substrate having a stack structure of a first silicon layer 10, a buried oxide film 11 and a second silicon layer 12 is provided. An isolation film 13 is formed on the second silicon layer 12 so as to be contacted with the buried oxide film 11. A trench 14 is formed on the second silicon layer 12 and a gate oxide film 15 and a conductive layer 16 for a gate are formed on the second silicon layer 12 where the trench 14 is formed and on the isolation film 13 in sequence.

Referring to FIG. 1B, gate electrodes 16a and 16b are formed on both sidewalls of the trench 14 by etching front side of the conductive layer 16. Impurity ions are injected into the second silicon layer 12, thereby forming a first, a second and a third impurity regions 17a, 17b and 17c thereto. Here, the first impurity region 17a and the second impurity region 17b are formed in upper surfaces of the second silicon layer 12 at the both side of the trench 14, and the third impurity region 17c is formed in the silicon layer 12 beneath the bottom of the trench 14. Particularly, the third impurity region 17c is formed so as to be contacted with both the trench 14 and the buried oxide film 11.

Referring to FIG. 1C, a first intermediate insulating layer 18 is formed on the gate oxide film 15 including the gate electrodes 16a and 16b so as to make the trench 14 to be buried. A first contact hole 18a and a second contact hole 18b which expose the first impurity region 17a and the second impurity region 17b are formed on the first intermediate insulating layer 18 according to the photolithography process. Storage electrodes 19 are also formed on the first intermediate insulating layer 18 to be in contact with the first impurity region 17a and the second impurity region 17b through the first contact hole 18a and the second contact hole 18b respectively. A dielectric layer 20 is formed on the storage electrodes 19 and the first intermediate insulating layer 18. A capacitor is constituted by forming a plate electrode 21 on the dielectric layer 20 to cover the storage electrodes 19a and 19b.

Referring to FIG. 1D, a second intermediate insulating layer 22 is formed on the plate electrode 21 and the dielectric layer 20. A third contact hole 22a which exposes the first silicon layer 10, is formed on the second intermediate insulating layer 22 according to the photolithography process. A first conductive layer pattern 24 is formed on the second intermediate insulating layer 22, the first conductive layer pattern 24 includes a first wiring 23 which is in contact with the first silicon layer 10 via the third contact hole 22a. A third intermediate insulating layer 25 is formed on the first conductive layer pattern 24 and the second intermediate insulating layer 22.

FIGS. 1E and 1F are sectional views for showing the above DRAM structure which is rotated by 180 degrees.

Referring to FIG. 1E, an insulating or a conductive dummy substrate 26 is bonded to the third intermediate insulating layer 25. Then, the first silicon layer 10 is removed. The dummy substrate 26 instead of the first silicon layer, serves to maintain the total thickness of DRAM device. A fourth contact hole 11a which exposes the third impurity region 17c, is formed in the buried oxide film 11. A bit line 27 which is in contact with the third impurity region 17c via the fourth contact hole 11a, is formed on the buried oxide film 11.

Referring to FIG. 1F, a fourth intermediate insulating layer 28 is formed on the bite line 27 and the buried oxide layer 11. A fifth contact hole 28a which exposes the first wiring 23, is formed in the fourth intermediate insulating layer 28 according to the photolithography process. A second conductive layer pattern 29 is formed on the fourth intermediate insulating layer 28. The second conductive layer pattern 29 includes a second wiring 29a which is in contact with the first wiring 23.

FIGS. 2A to 2F are sectional views for showing another conventional DRAM fabricating method.

Referring to FIG. 2A, an SOI substrate having a stack structure including a first silicon layer 30, a buried oxide film 31 and a second silicon layer 32 is provided. An isolation film 33 which defines an active region, is formed in the second silicon layer 32 so as to be contacted with the buried oxide film 31. A first trench 34a and a second trench 34b are separately formed on the second silicon layer 32 according to the photolithography process. Herein, the first trench 34a and the second trench 34b are contacted isolation film 33 respectively. A gate oxide film 35 and a conductive layer 36 for a gate are formed on the second silicon layer 32 which includes the first trench 34a and the second trench 34b, and the isolation film 33 in sequence.

Referring to FIG. 2B, gate electrodes 36a through 36d are formed on both sidewalls of the first trench 34a and the second trench 34b by etching the entire conductive layer for gate 36. Impurity ions are injected into the second silicon layer 32, thereby forming a first and a second impurity regions 37a and 37b in the second silicon layer 32 beneath the bottom surfaces of the first trench 34a and the second trench 34b and a third impurity region 37c in the surface of the second silicon layer 32 between the first trench 34a and the second trench 34b. Herein, the first impurity region 37a is formed in contact with the first trench 34a and the buried oxide film 31, and the second impurity region 37b is formed in contact with the second trench 34b and the buried oxide film 31.

Referring to FIG. 2C, a first intermediate insulating layer 38 is formed on the gate oxide film 35 including the gate electrodes 36a through 36b so as to make the trenches to be buried. A first contact hole which exposes the third impurity region 37c, is formed in the first intermediate insulating layer 38 according to the photolithography process. A bit line 39 is formed on the the first intermediate insulating layer 38 to be contacted with the third impurity region 37c through the first contact hole 38a.

Referring to FIG. 2D, a second intermediate insulating layer 40 is formed on the bit line 39 and the first intermediate insulating layer 38. A second contact hole 40a which exposes the first silicon layer 30, is formed on the second intermediate insulating layer 38 according to the photolithography process. A first conductive layer pattern 42 is formed on the second intermediate insulating layer 40, and the first conductive layer pattern 42 includes a first wiring 41 which is in contact with the first silicon layer 30 via the second contact hole 40a. A third intermediate insulating layer 43 is formed on the first conductive layer pattern 42 and the second intermediate insulating layer 40.

FIGS. 2E and 2F are sectional views for showing the above DRAM structure which is rotated by 180 degrees.

Referring to FIG. 2E, an insulating or a conductive dummy substrate 44 is attached to the third intermediate insulating layer 43. Then, the first silicon layer 30 is removed. A third contact hole and a fourth contact hole 31b which expose the first impurity region 37a and the second impurity region 37b, are formed in the buried oxide film 31 according to the photolithography process. Storage electrodes 45a and 45b which are in contact with the first impurity region 37a and the second impurity region 37b via the third and the fourth contact holes 31a and 31b, are formed in the buried oxide film 31.

Referring to FIG. 2F, a dielectric layer 46 is formed on the storage electrodes 45, the buried oxide film 31 and the first wiring 41. A capacitor is constituted by forming a plate electrode 47 to cover the storage electrodes 45a and 45b on the dielectric layer 46. A fourth intermediate insulating layer 48 is formed on the plate electrode 47 and the dielectric layer 46. A fifth contact hole 48a which exposes the first wiring 41, is formed in the fourth intermediate insulating layer 48 according to the photolithography process. A second conductive layer pattern 50 is formed on the fourth intermediate insulating layer 48. The second conductive layer pattern 50 includes a second wiring 49 which is in contact with the first wiring 41 via the fifth contact hole 48a.

The DRAM device fabricated as described above has no parasitic capacitance between the bit line and the capacitor though its entire size may reduce, since the bit line is formed on one side of the second silicon layer and the capacitor is formed on the other side of the second silicon layer i.e. an active layer 32. Therefore DRAM device as constructed above has a high applicability to the integration thereof.

However, it is not easy to perform etching process when the wirings are formed so as to connect a first conductive layer pattern formed in the upper of the second silicon layer and a second conductive layer pattern formed in the bottom of the second silicon layer since it is required to etch at once a plurality of layers including buried oxide film, isolation film and the intermediate insulating layer in a first wiring among the wirings.

Furthermore, the planarization and the photolithography process are affected by the aspect ratio in layers which is not desired from the contact hole forming region during sequential layer forming processes.

SUMMARY OF THE INVENTION

It is an object of the present invention to provide a method for fabricating DRAM device having a stabilized etching process.

So as to achieve the above object, the method according to one embodiment of the present invention comprises the steps of: providing a silicon-on-insulator substrate that a first silicon layer, a buried oxide film and a second silicon layer are stacked; forming an isolation film in the second silicon layer; forming a first trench and a second trench in the second silicon layer and in the isolation film respectively; forming gate electrodes in both sidewalls of the first and the second trenches; forming a first impurity region and a second impurity region in the upper surface of both sides of the first trench and a third impurity region beneath the first trench, and a fourth impurity region beneath the second trench by injecting impurity ions into the second silicon layer; forming a first intermediate insulating layer on the entire substrate; forming a first, a second and a third contact holes in the first intermediate insulating layer so as to expose the first, the second and the fourth impurity regions respectively; forming a capacitor which is in contact with the first and the second impurity regions via the first and the second contact holes, and a first wiring which is in contact with the fourth impurity region via the third contact hole, on the first intermediate insulating layer; forming a second intermediate insulating layer to cover the capacitor and the first wiring on the first intermediate insulating layer; forming a fourth contact hole which exposes the first wiring, in the second intermediate insulating layer; forming a first conductive layer pattern including a second wiring which is in contact with the first wiring via the fourth contact hole, on the second intermediate insulating layer; bonding a dummy substrate to the third intermediate insulating layer; removing the first silicon layer; forming a fifth and a sixth contact holes in the buried oxide film so as to expose the third and the fourth impurity region s respectively; forming a b it line and a third wiring connected to the third and the fourth impurity regions via the fifth and the sixth contact holes respectively, on the buried oxide film; forming a fourth intermediate insulating layer on the bit line, the third wiring and the buried oxide film; forming a seventh contact hole which exposes the third wiring in the fourth intermediate insulating layer; and forming a second conductive layer pattern including the fourth wiring which is in contact with the third wiring via the seventh contact hole, on the fourth intermediate insulating layer.

DETAILED DESCRIPTION OF THE INVENTION

FIGS. 3A to 3G are sectional views for showing the DRAM device according to one embodiment of the present invention.

Figure 1A:
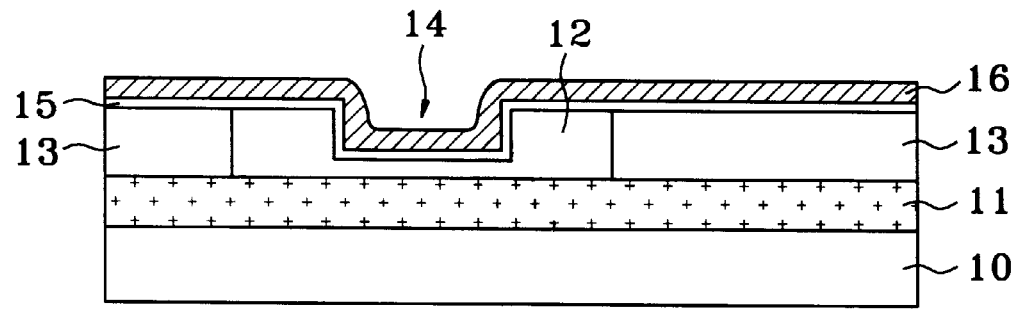
FIGS. 1A to 1F are sectional views for showing a conventional DRAM fabricating method.
Figure 1B:
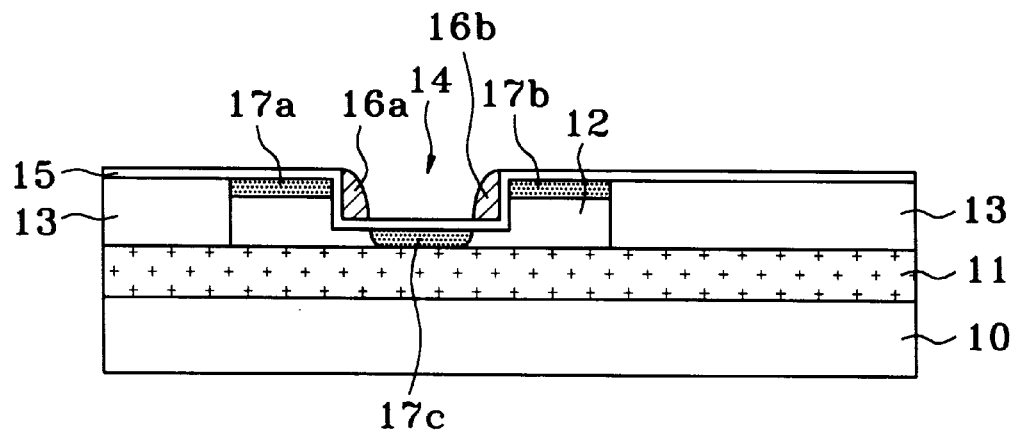
Figure 1C:
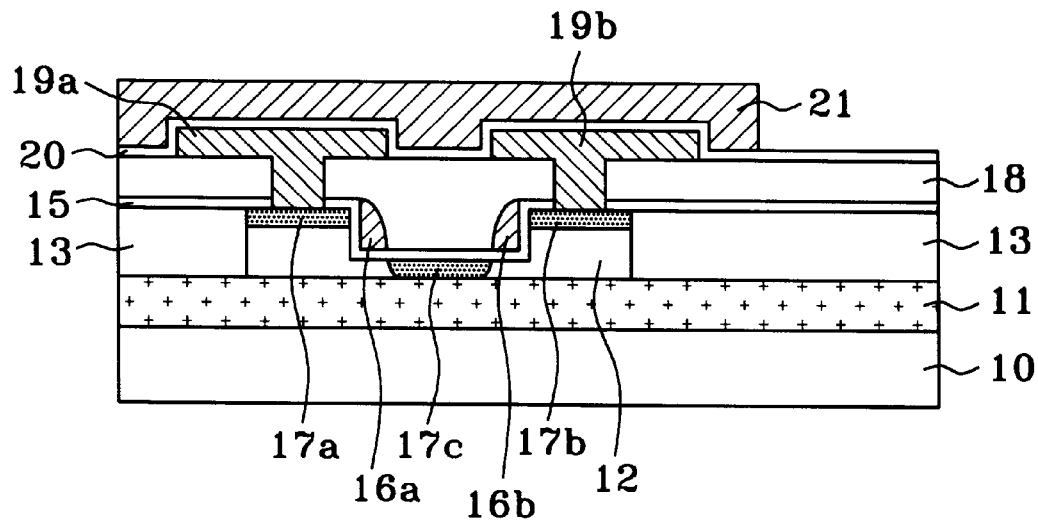
Figure 1D:
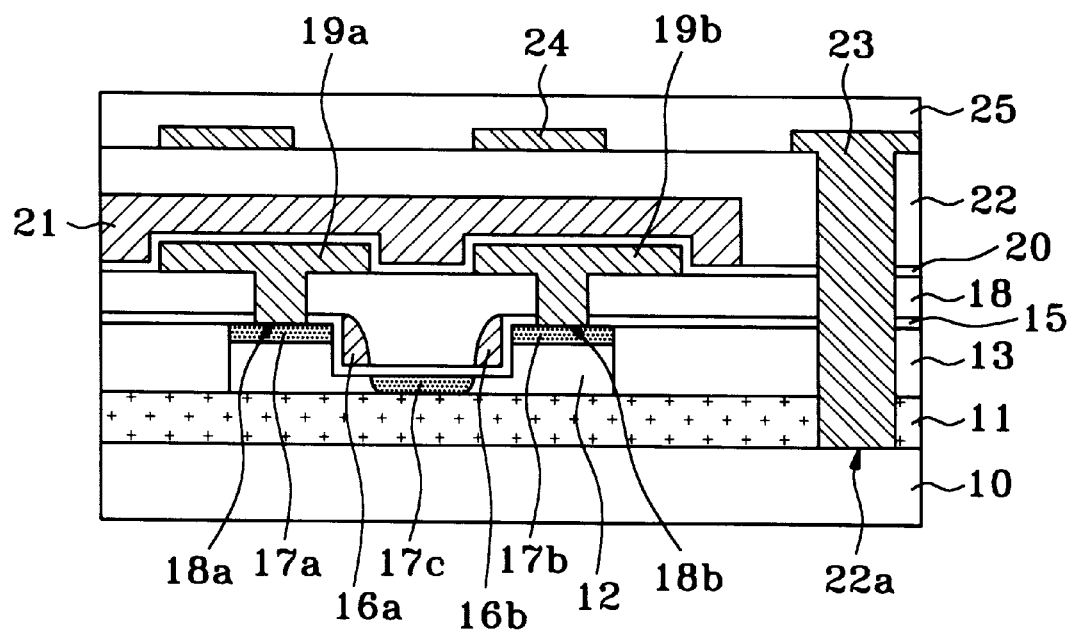
Figure 1E:
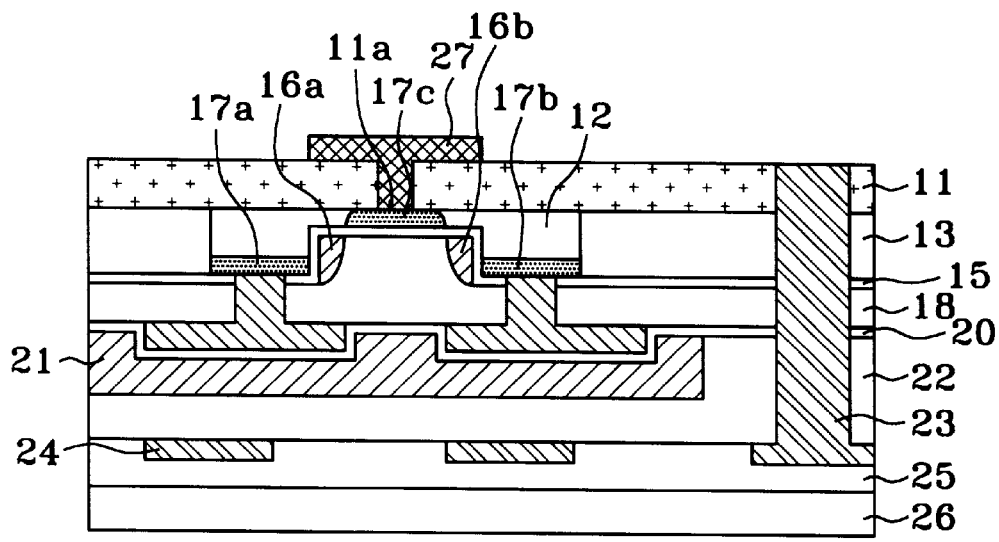
Figure 1F:
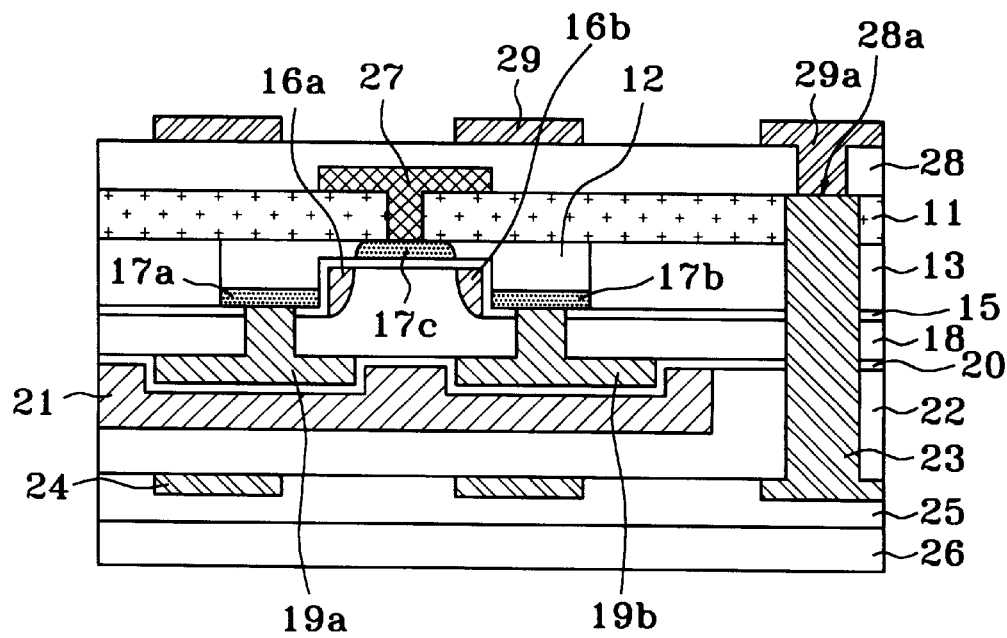
Figure 2A:
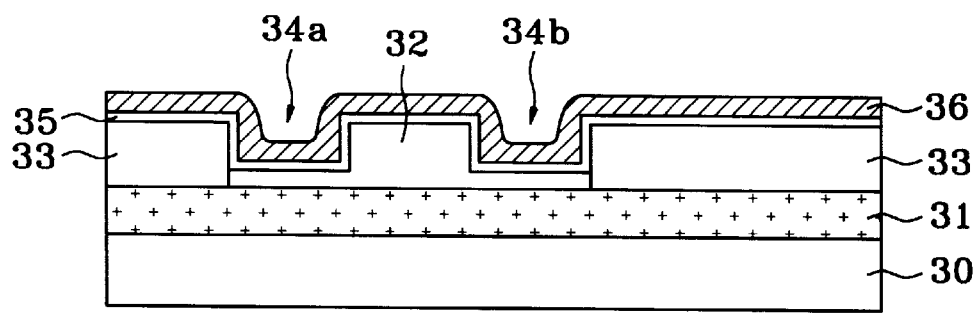
FIGS. 2A to 2F are sectional views for showing another conventional DRAM fabricating method.
Figure 2B:
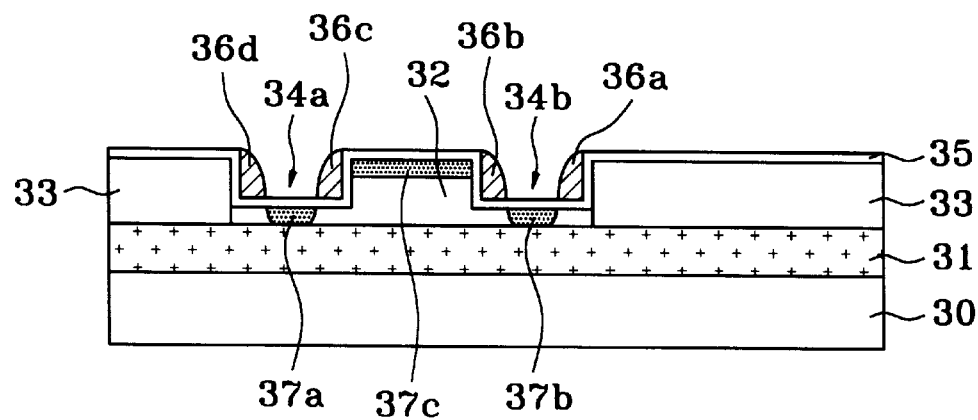
Figure 2C:
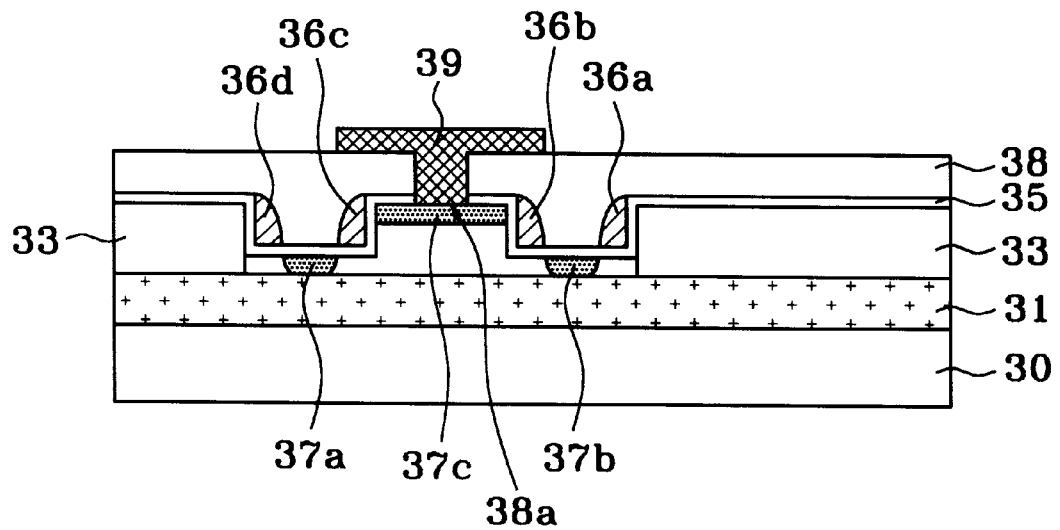
Figure 2D:
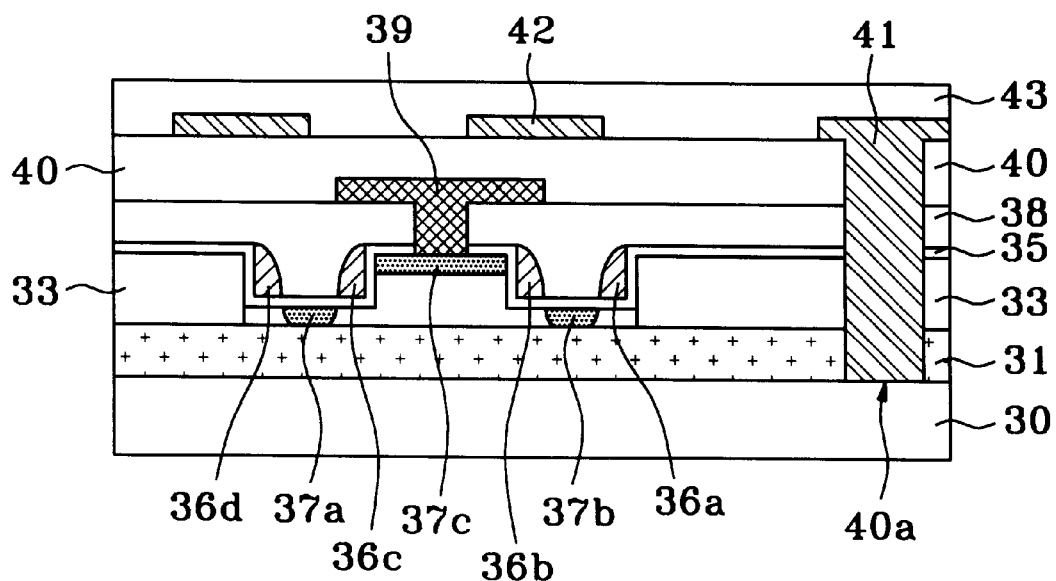
Figure 2E:
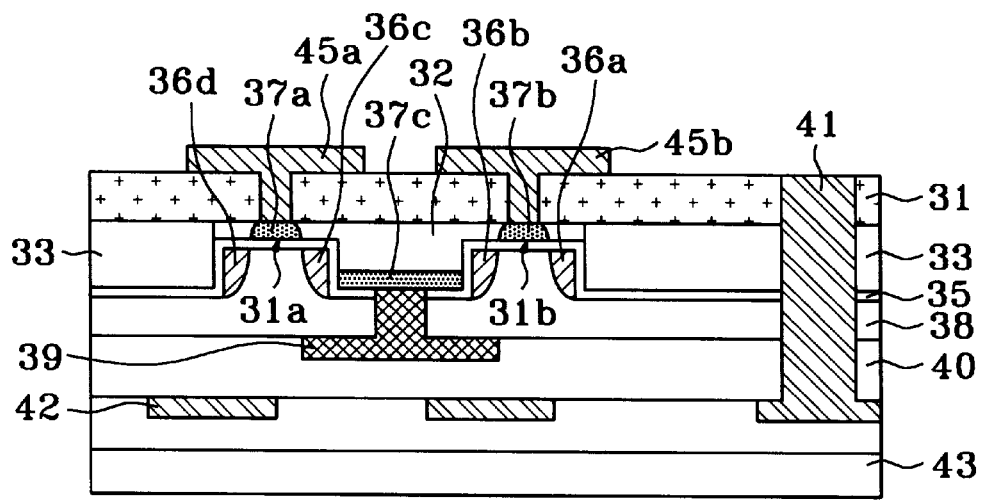
Figure 2F:
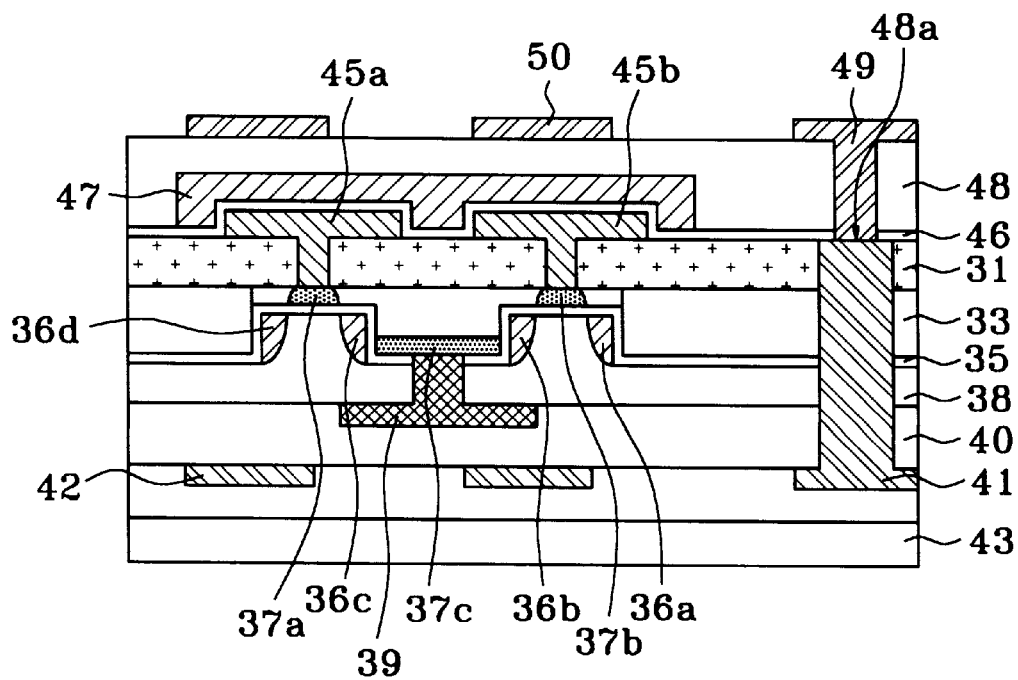
Figure 3A:
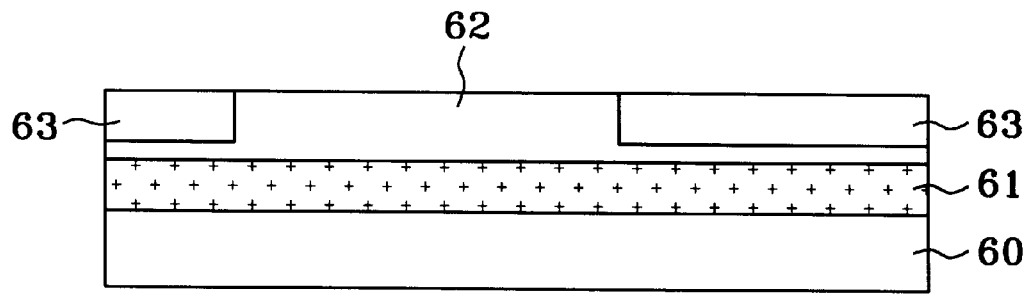
FIGS. 3A to 3G are sectional views for showing a method for fabricating DRAM according to one embodiment of the present invention.
Figure 3B:
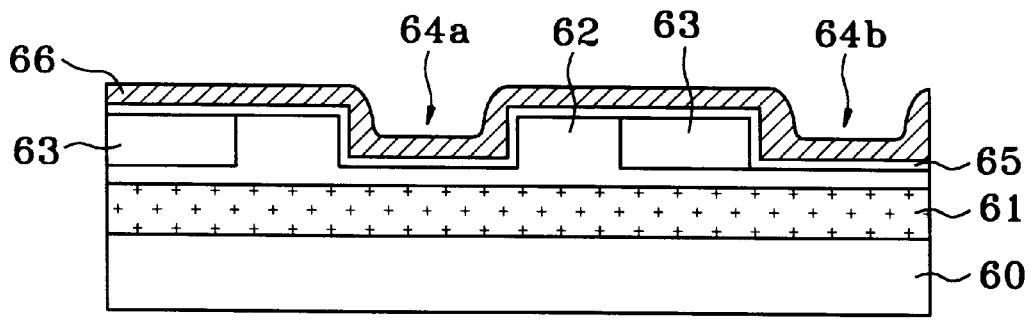

Referring to FIG. 3A, an SOI substrate having a stack structure including a first silicon layer 60, a buried oxide film 61 and a second silicon layer 62 is provided. An isolation film 63 is formed in the second silicon layer 62 which defines an active region. The isolation film 63 is formed with a selected depth to be separated from the buried oxide layer 61. However, it may be formed to be in contact with each other. Referring to FIG. 3b, a first trench 64a and a second trench 64b are formed in the second silicon layer 62 and the isolation film 63 respectively. A gate oxide film 65 and a conductive layer 66 for a gate are formed on the second silicon layer 62 and the isolation film 63 in sequence.

Figure 3C:
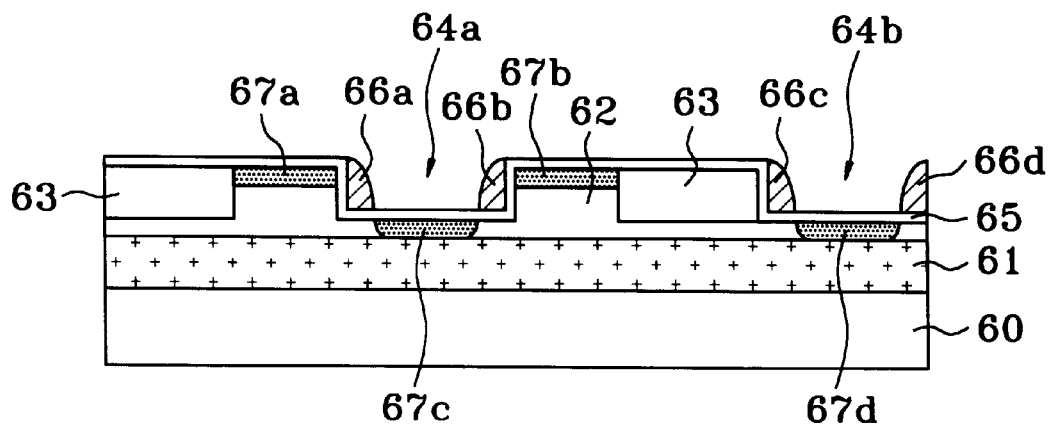

Referring to FIG. 3C, gate electrodes 66a through 66d are formed on both sidewalls of the first trench 64a and the second trench 64b by etching-back the conductive layer 66 for a gate. Impurity ions are injected into the second silicon layer 62, thereby forming a first impurity region 67a and a second impurity region 67b in the upper surface of the second silicon layer 62 between trenches 64a and 64b. A third impurity region 67c is formed beneath the bottom portion of the first trench 64a and a fourth impurity region 67d is formed beneath the bottom portion of the second trench 64b. Herein, the third impurity region 67c and the fourth impurity region 67d are formed to contact with the buried oxide film 61.

Figure 3D:
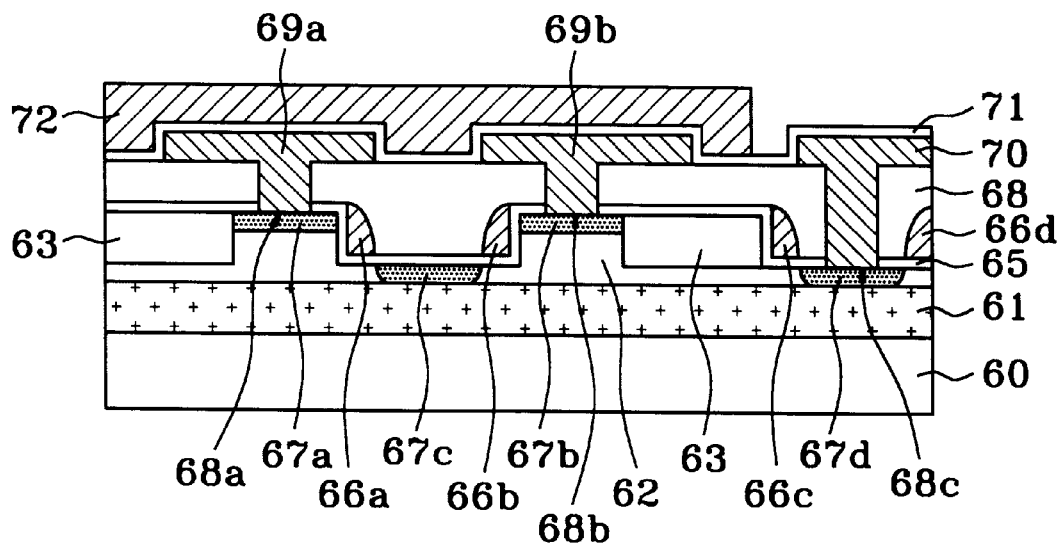

Referring to FIG. 3D, a first intermediate insulating layer 68 is formed on the gate oxide film 65 including the gate electrodes 66a through 66d. A first, a second and a third contact holes 68a, 68b and 68c which expose the first, the second and the fourth impurity regions 67a, 67b and 67d respectively, are formed in the first intermediate insulating layer 68 according to the photolithography process. Storage electrodes 69a and 69b which are in contact with the first and the second impurity regions 67a and 67b via the first and the second contact holes 68a and 68b respectively, and a first wiring 70 which is in contact with the fourth impurity region 67d via the third contact hole 68c, are formed on the first intermediate insulating layer 68 according to the deposition and etching process of conductive layer. A dielectric layer 71 is formed on the storage electrodes 69a and 69b, the first wiring 70 and the first intermediate insulating layer 68. A capacitor is constituted by forming a plate electrode 72 to cover the storage electrodes 69a and 69b on the dielectric layer 71.

Figure 3E:
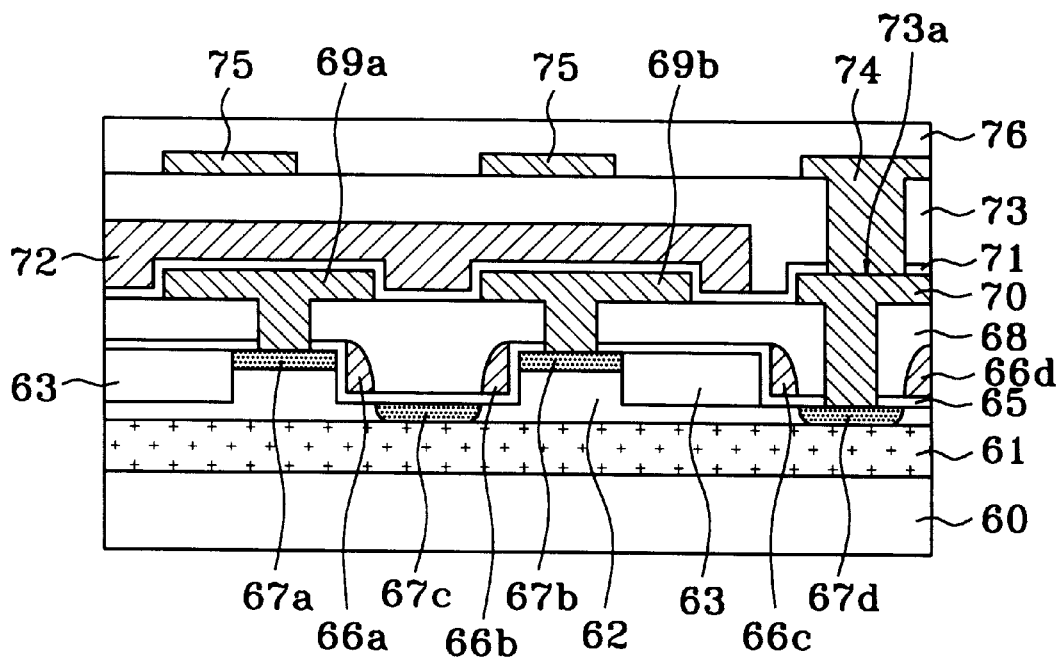

Referring to FIG. 3E, a second intermediate insulating layer 73 is formed on the plate electrode 72 and the dielectric layer 71. A fourth contact hole 73a which exposes the first wiring 70, is formed in the second intermediate insulating layer 73 by etching the second intermediate insulating layer 73 and the dielectric layer 71 according to the photolithography process. A first conductive layer pattern 75 is formed on the second intermediate insulating layer 73 according to the deposition and the etching process of the conductive layer, the first conductive layer pattern 75 includes a second wiring 74 which is in contact with the first wiring 71 via the fourth contact hole 73a. A third intermediate insulating layer 76 is formed on the first conductive layer pattern 75 and the second intermediate insulating layer 73.

Figure 3F:
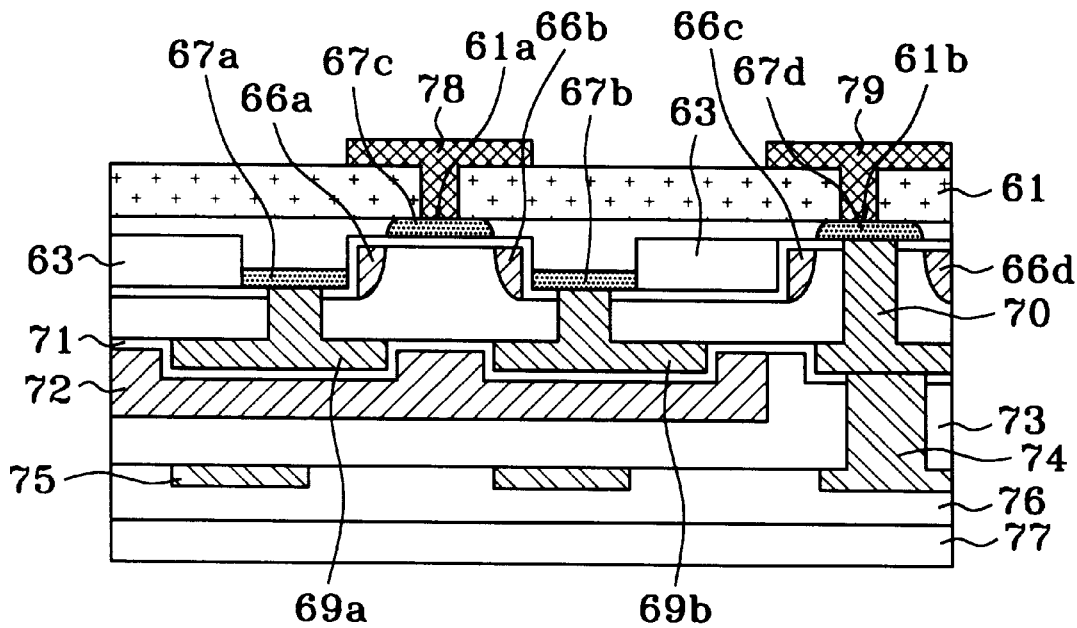
Figure 3G:
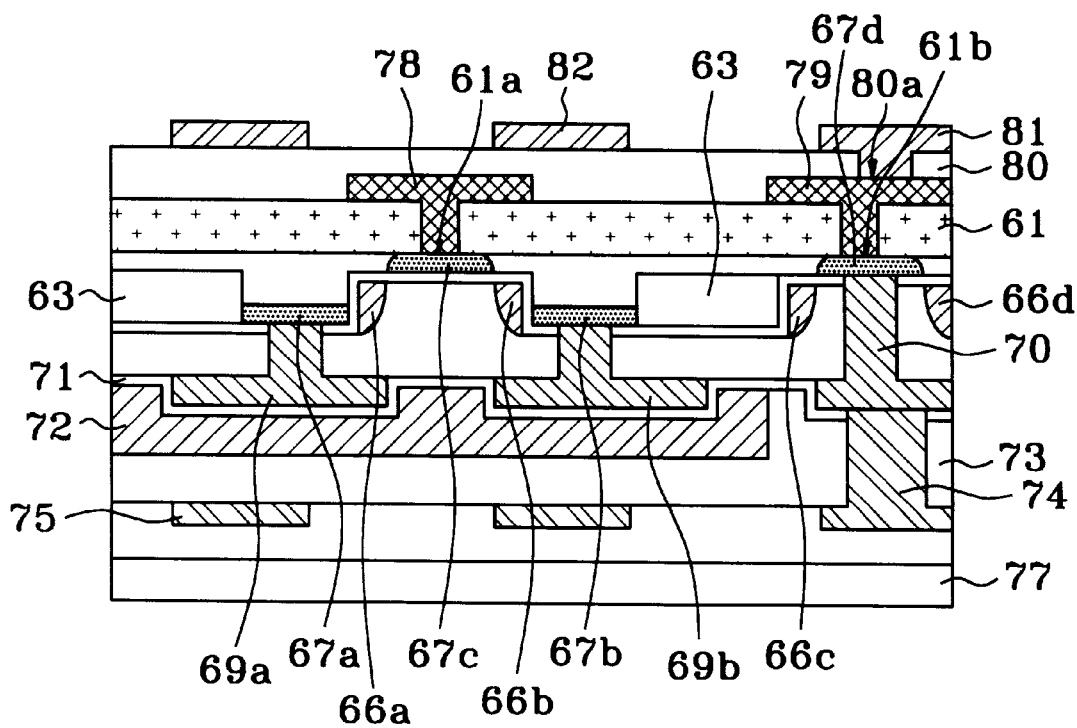

FIGS. 3F and 3G are sectional views for showing the above DRAM structure which is rotated by 180 degrees.

Referring to FIG. 3F, an insulating or a conductive dummy substrate 77 is bonded to the third intermediate insulating layer 76. Then, the first silicon layer 60 is removed so that the rear side of the buried oxide film 61 is exposed. The dummy substrate 77 instead of the first silicon layer, serves to put a mechanical intensity onto the entire structure of the DRAM device and to prevent unstableness in the etching process. Next, a fifth and a sixth contact holes 61a and 61b which expose the third and the fourth impurity regions 67c and 67d respectively, are formed in the buried oxide film 61 by a photolithography process and a conductive layer is deposited on the buried oxide film 61 and then etched according to the photolithography, thereby forming a bit line 78 and a third wiring 79. That is, the bit line 78 which is in contact with the third impurity region 67c via the fifth contact hole 67c and a third wiring 79 which is in contact with the fourth impurity region 67d via the sixth contact hole 67d, are formed on the buried oxide film 61 by etching the conductive layer. The third wiring 79 is electrically connected to the first wiring 70 via the fourth impurity region 67d.

Referring to FIG. 3G, a fourth intermediate insulating layer 80 is formed in the bite line 78, the third wiring 79 and the buried oxide layer 61. A seventh contact hole 80a which exposes the third wiring 79, is formed on the fourth intermediate insulating layer 80 according to the photolithography process. A conductive layer is deposited with a thickness which may bury the seventh contact hole 80a on the entire resultant structure and the photolithography process is performed to the conductive layer. Therefore, a second conductive layer pattern 82 is formed on the fourth intermediate insulating layer 80. The second conductive layer pattern 82 includes a fourth wiring 81 which is in contact with the third wiring 79 via the seventh contact hole 80a.

According to this embodiment of the present invention, the wiring for connecting the first conductive layer pattern and the second conductive layer pattern, consists of contacts of a plurality of wirings which are formed in each layer. Therefore it is quite easy to perform the etching process. That means, the difficulty of etching process is decreased since the wirings are formed by etching the layers at each forming step thereof. Therefore, the stabilization in the etching process is accomplished and also the yield of the finished DRAM products is improved.

FIGS. 4A to 4G are drawings for showing a method for fabricating DRAM device according to another embodiment of the present invention.

Figure 4A:
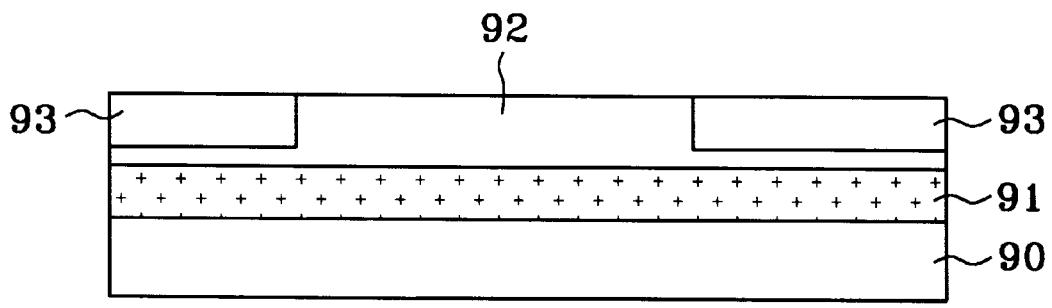
FIGS. 4A to 4G are sectional views for showing a method for fabricating DRAM according to another embodiment of the present invention.
Figure 4B:
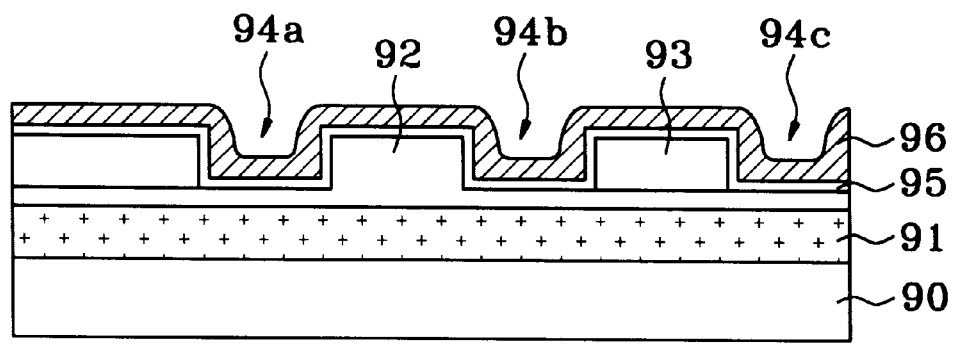
Figure 4C:
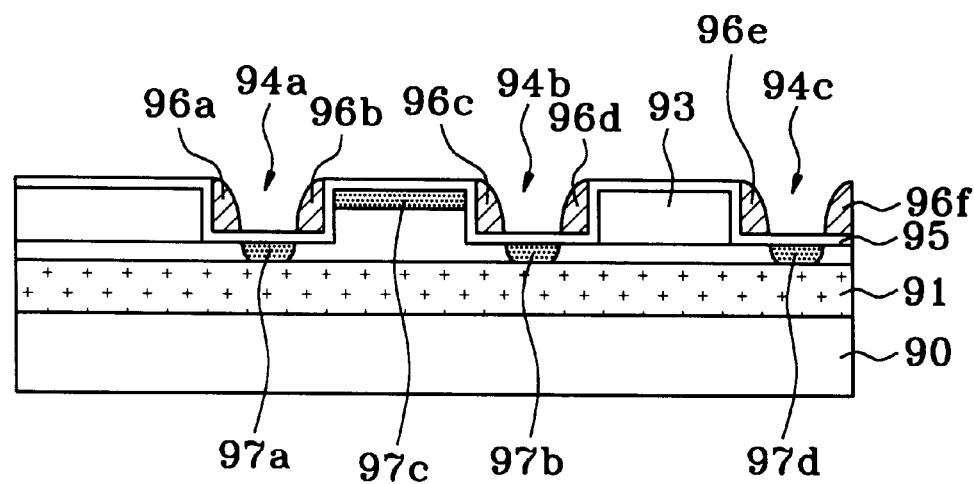

Referring to FIG. 4A, an SOI substrate having a stack structure including a first silicon layer 90, a buried oxide film 91 and a second silicon layer 92, is provided. An isolation film 93 is formed in the second silicon layer 92 to be set apart. However, it may be formed to be in contact with each other. Referring to FIG. 4B, a first trench 94a and a second trench 94b are separately formed in the second silicon layer 92 and a third trench 94c is formed in the isolation film 93. The first and the second trenches are in contact with the isolation film 93. A gate oxide film 95 and a conductive layer 96 for a gate are formed on the entire surface of structure in sequence. Referring to FIG. 4C, gate electrodes 96a through 96f are formed on both sidewalls of each trench by etching-back the conductive layer 96. Impurity ions are injected into the second silicon layer 92, thereby forming a first, a second and a fourth impurity regions 97a, 97b and 97d in the second silicon layer 62 beneath the bottom portions of the first trench 94a, the second trench 94b and the fourth trench 94d. A third impurity region 97c is formed in the upper surface of the second silicon layer between the first and the second trenches 94a and 94b. Herein, the first, the second and the fourth impurity regions 97a, 97b and 97d are formed in contact with the buried oxide film 91.

Figure 4D:
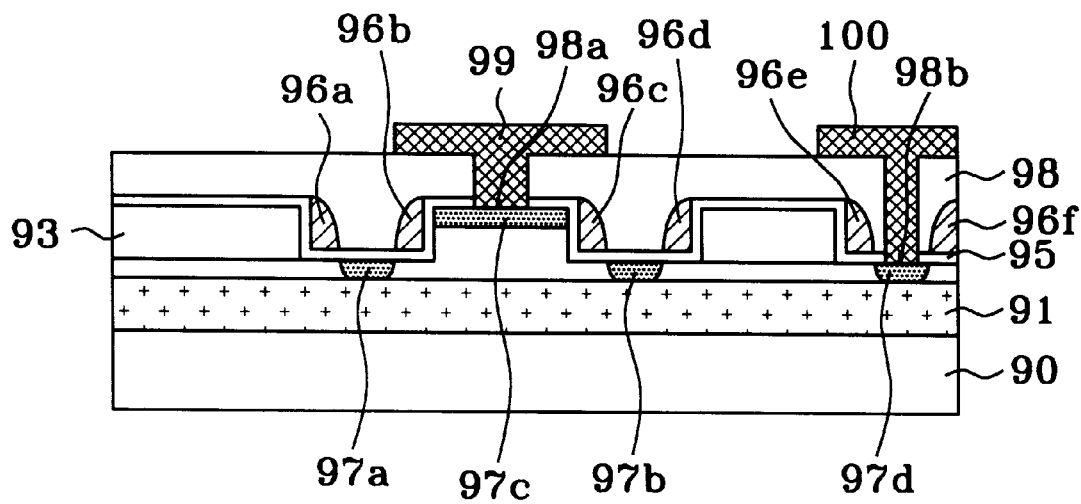

Referring to FIG. 4D, a first intermediate insulating layer 98 whose surface is even, is formed on the gate oxide film 95 including the gate electrodes 96a through 96f so as to make the trenches 94a and 94b to be buried. A first contact hole 98a and a second contact hole 98b which expose the third impurity region 97c and the fourth impurity region 97d respectively, are formed in the first intermediate insulating layer 98 according to the photolithography process. A bit line 99 which is in contact with the third impurity region 97c via the first contact hole 98a, and a first wiring 100 which is in contact with the fourth impurity region 97d via the second contact hole 98b, are formed on the first intermediate insulating layer 98.

Figure 4E:
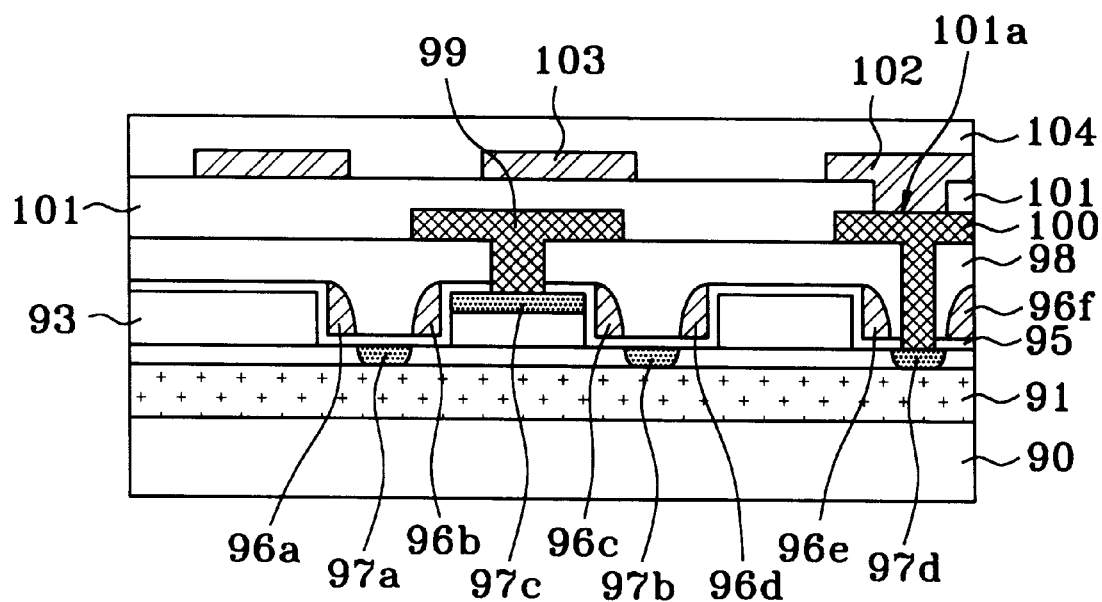

Referring to FIG. 4E, a second intermediate insulating layer 101 is formed on the bit line 99, the first wiring 100 and the first intermediate insulating layer 98. A third contact hole 110a which exposes the first wiring 100, is formed in the second intermediate insulating layer 101 according to the photolithography process. A first conductive layer pattern 103 is formed on the second intermediate insulating layer 101, the first conductive layer pattern 103 includes a second wiring 102 which is in contact with the first wiring 100 via the third contact hole 110a. A third intermediate insulating layer 104 is formed on the first conductive layer pattern 103 which includes the second wiring 102 and the second intermediate insulating layer 101.

Figure 4F:
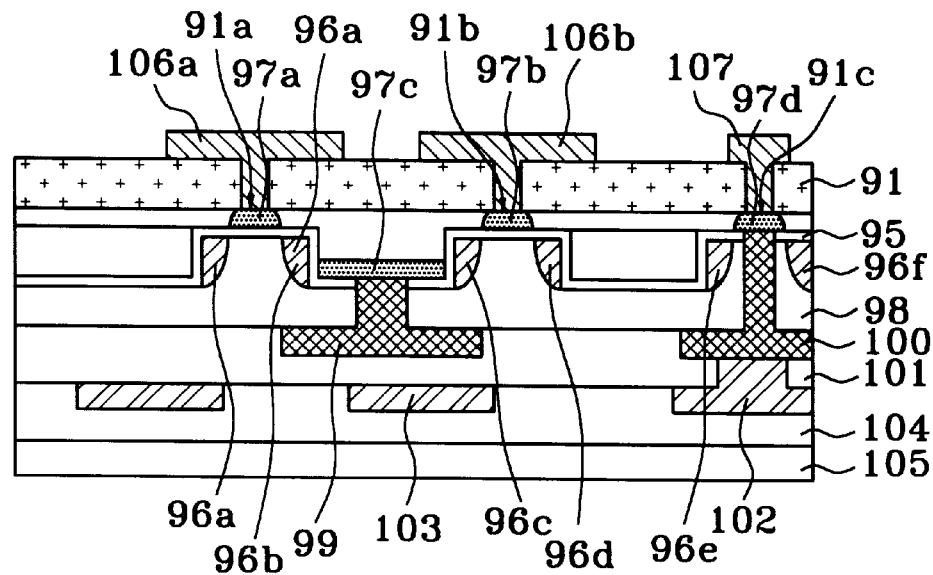
Figure 4G:
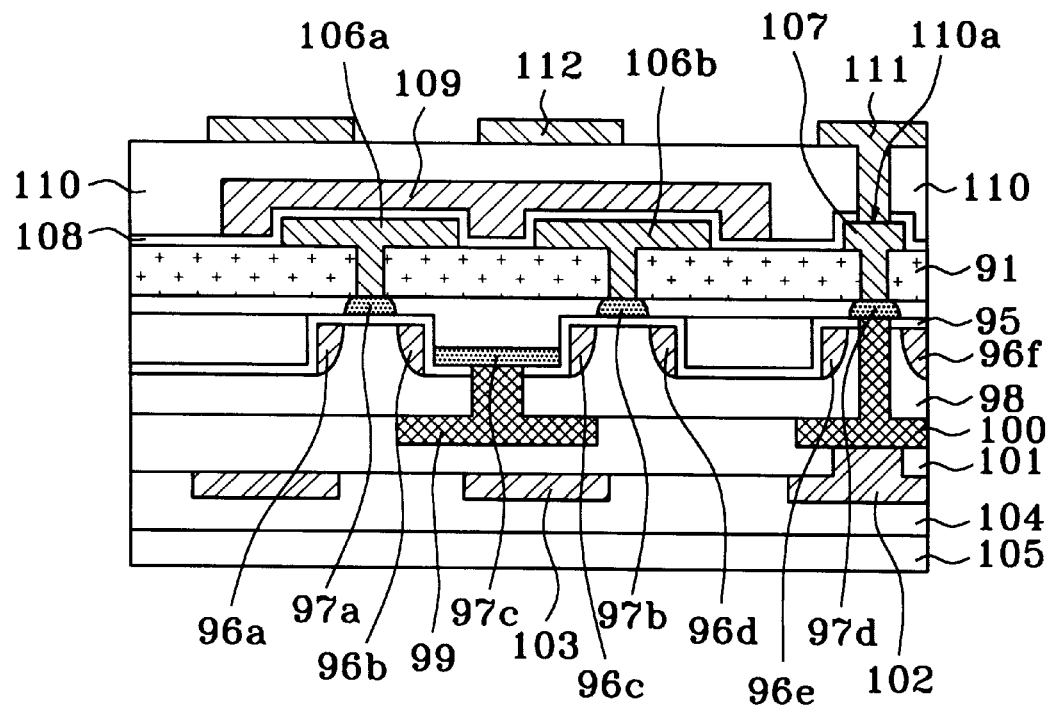

FIGS. 4F and 4G are drawings for showing the above DRAM structure which is rotated by 180 degrees.

Referring to FIG. 4F, an insulating or a conductive dummy substrate 105 is bonded to the third intermediate insulating layer 104. Then, the first silicon layer is removed. The photolithography process is performed in the exposed buried oxide film 91, and therefore a fourth, a fifth and a sixth contact holes 91a to 91c which expose the first, the second and the fourth impurity regions 97a, 97b and 97d respectively, are formed in the buried oxide film 91. Storage electrodes 106a and 106b which are in contact with the first impurity region 97a and the second impurity region 97b via the fourth and the fifth contact holes 91a and 91b respectively, are formed on the buried oxide film 91. Also, the third wiring 107 which is in contact with the fourth impurity region 97d via the sixth contact hole 91c, is formed on the buried oxide film 91. Herein, the third wiring 107 is electrically connected to the first wiring 100 via the fourth impurity region 97d.

Referring to FIG. 4G, a dielectric layer 108 is formed on the storage electrodes 106a and 106b, the third wiring 107 and the buried oxide film 91. A capacitor is constituted by forming a plate electrode 109 to cover the storage electrodes 106 on the dielectric layer 108. A fourth intermediate insulating layer 110 whose surface is even, is formed in the plate electrode 109 and the dielectric layer 108. A seventh contact hole 110a which exposes the third wiring 107, is formed on the fourth intermediate insulating layer 110 according to the photolithography process. A second conductive layer pattern 112 is formed on the fourth intermediate insulating layer 110. The second conductive layer pattern 112 includes a fourth wiring 111 which is in contact with the third wiring 107 via the seventh contact hole 110a.

The DRAM device fabricated similarly as the above embodiment of the present invention, has the structure that the first conductive layer pattern and the second conductive layer pattern are connected each other by means of a plurality of contacts of wirings. Therefore DRAM device having the above constitution can improve stability in the etching process and also has a high applicability to the integration thereof.

While the invention has been particularly shown and described with respect to preferred embodiments thereof, it will be understood by those skilled in the art that various changes in form and details may be made therein without departing from the spirit and the scope of the invention as defined by the following claims.

What is claimed is:

1. A method for fabricating a Dynamic Random Access Memory, comprising the steps of:

providing a silicon-on-insulator substrate that a first silicon layer, a buried oxide film and a second silicon layer are stacked;

forming an isolation film in the second silicon layer;

forming a first trench and a second trench in the second silicon layer and in the isolation film respectively;

forming gate electrodes in both sidewalls of the first and the second trenches;

forming a first impurity region and a second impurity region in the upper surface of both sides of the first trench and a third impurity region beneath the first trench, and a fourth impurity region beneath the second trench by injecting impurity ions into the second silicon layer;

forming a first intermediate insulating layer on the entire substrate;

forming a first, a second and a third contact holes in the first intermediate insulating layer so as to expose the first, the second and the fourth impurity regions respectively;

forming a capacitor which is in contact with the first and the second impurity regions via the first and the second contact holes, and a first wiring which is in contact with the fourth impurity region via the third contact hole, on the first intermediate insulating layer;

forming a second intermediate insulating layer to cover the capacitor and the first wiring on the first intermediate insulating layer;

forming a fourth contact hole which exposes the first wiring, in the second intermediate insulating layer;

forming a first conductive layer pattern including a second wiring which is in contact with the first wiring via the fourth contact hole, on the second intermediate insulating layer;

bonding a dummy substrate to the third intermediate insulating layer;

removing the first silicon layer;

forming a fifth and a sixth contact holes in the buried oxide film so as to expose the third and the fourth impurity regions respectively;

forming a bit line and a third wiring connected to the third and the fourth impurity regions via the fifth and the sixth contact holes respectively, on the buried oxide film;

forming a fourth intermediate insulating layer on the bit line, the third wiring and the buried oxide film;

forming a seventh contact hole which exposes the third wiring in the fourth intermediate insulating layer; and forming a second conductive layer pattern including the fourth wiring which is in contact with the third wiring via the seventh contact hole, on the fourth intermediate insulating layer.

2. The method of claim 1, wherein the isolation film is formed separately from the buried oxide film.

3. The method of claim 1, wherein the third and the fourth impurity regions are in contact with the buried oxide film.

4. The method of claim 1, wherein the isolation film is in contact with the buried oxide film.

5. The method of claim 1, wherein the method of forming the gate comprises the steps of:

forming a gate oxide film and a conductive layer for the gate on the second silicon layer in which the first trench is formed, and the isolation film in which the second trench is formed in sequence; and etching-back the conductive layer to form the gate.

6. The method of claim 1, wherein the method of forming the capacitor comprises the steps of:

depositing a conductive layer on the first intermediate insulating layer in which the first, the second and the third contact holes are formed;

forming storage electrodes in contact with the first and the second impurity regions via the first and the second contact holes by etching the conductive layer;

forming dielectric layer on the storage electrodes and the first intermediate insulating layer; and forming a plate electrode to cover the storage electrodes on the dielectric layer.

7. A method for fabricating a Dynamic Random Access Memory device comprising the steps of:

providing a silicon-on-insulator substrate that a first silicon layer, a buried oxide film and a second silicon layer are stacked;

forming an isolation film in the second silicon layer;

forming a first trench and a second trench in the second silicon layer and a third trench in the isolation film respectively;

forming gate electrodes in both sidewalls of each trench;

forming a first impurity region and a second impurity region beneath the first trench and the second trench respectively, a third impurity region in the surface between the first trench and the second trench, and a fourth impurity region beneath the third trench by injecting impurity ions into the second silicon layer;

forming a first intermediate insulating layer on the entire surface of the substrate;

forming a first and a second contact holes which expose the third and the fourth impurity regions respectively;

forming a bit line which is in contact with the third impurity region via the first contact hole, and a first wiring which is in contact with the fourth impurity region via the second contact hole, on the first intermediate insulating layer;

forming second intermediate insulating layers on the bit line, the first wiring and the first intermediate insulating layer;

forming a third contact hole on the second intermediate insulating layer so as to expose the first wiring;

forming a first conductive layer pattern including a second wiring which is in contact with the first wiring via the third contact hole, on the second intermediate insulating layer;

forming third intermediate insulating layer on the first conductive layer pattern and the second intermediate insulating layer;

bonding a dummy substrate to the third intermediate insulating layer;

removing the first silicon layer;

forming a fourth, a fifth and a sixth contact holes on the buried oxide film so as to expose the first, the second and the fourth impurity regions respectively;

forming storage electrodes in contact with the first and the second impurity regions through the fourth and the fifth contact holes respectively, and a third wiring in contact with the fourth impurity region through the sixth contact hole;

forming dielectric layer and a plate electrode on the storage electrodes, the third wiring and the buried oxide film to form a capacitor;

forming fourth intermediate insulating layer on the plate electrode and the dielectric layer;

forming a seventh contact hole on the fourth intermediate insulating layer so as to expose the third wiring; and forming a fourth wiring which is in contact with the third wiring via the seventh contact hole and a second conductive layer pattern, in the fourth intermediate insulating layer.

8. The method of claim 7, wherein the isolation film is formed separately from the buried oxide film.

9. The method of claim 7, wherein the first, the second and the fourth impurity regions are in contact with the buried oxide film.

10. The method of claim 7, wherein the isolation film is in contact with the buried oxide film.

11. The method of claim 7, wherein the first and the second trenches are in contact with the isolation film.

12. The method of claim 7, wherein the method of forming the gate comprises the steps of:

forming a gate oxide film and a conductive layer for the gate on the second silicon layer in which the first trench and the second trench are formed, and on the isolation film in which the third trench is formed in sequence; and etching-back the conductive layer for gate.

13. The method of claim 7, wherein the dummy substrate is comprised of one of an insulating substrate or a conductive substrate.

* * * * *